(12) United States Patent
Park et al.

(10) Patent No.: US 9,614,157 B2
(45) Date of Patent: Apr. 4, 2017

(54) ORGANIC LIGHT EMITTING DIODE DISPLAY HAVING A PLURALITY OF DATA DRIVERS AND MANUFACTURING METHOD THEREOF

(71) Applicant: SAMSUNG DISPLAY CO., LTD., Yongin, Gyeonggi-Do (KR)

(72) Inventors: Jong-Hyun Park, Cheongju-si (KR); Chun Gi You, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/622,701

(22) Filed: Feb. 13, 2015

(65) Prior Publication Data

US 2016/0064673 A1   Mar. 3, 2016

(30) Foreign Application Priority Data

Sep. 2, 2014  (KR) .................. 10-2014-0116356

(51) Int. Cl.
*H01L 51/00*  (2006.01)
*H01L 27/32*  (2006.01)

(52) U.S. Cl.
CPC ...... *H01L 51/0031* (2013.01); *H01L 27/3258* (2013.01); *H01L 27/3276* (2013.01)

(58) Field of Classification Search
CPC ..... H01L 51/56; H01L 51/52; H01L 51/5268; H01L 51/5203; H01L 51/5275; H01L 51/0031; H01L 27/3276; H01L 27/3258; H01L 27/32

USPC .................. 257/40, E51.019; 438/29, 17
See application file for complete search history.

(56) References Cited

U.S. PATENT DOCUMENTS

| 8,228,269 B2 | 7/2012 | Nakano et al. |
| 2007/0075937 A1* | 4/2007 | Kim .................. G09G 3/3233 345/76 |
| 2014/0197382 A1* | 7/2014 | Kim .................. H01L 29/45 257/40 |

FOREIGN PATENT DOCUMENTS

| KR | 10-0312760 B1 | 11/2001 |
| KR | 10-2006-0084201 A | 7/2006 |
| KR | 10-0897171 B1 | 5/2009 |

* cited by examiner

*Primary Examiner* — Selim Ahmed
(74) *Attorney, Agent, or Firm* — Lewis Roca Rothgerber Christie LLP

(57) ABSTRACT

An organic light emitting diode (OLED) display includes an OLED display panel having a substrate; a plurality of scan lines formed on the substrate; a plurality of data lines crossing the plurality of scan lines; cover lines covering the data lines; a plurality of switching elements coupled to the plurality of scan lines and the plurality of data lines; and a plurality of organic light emitting diodes coupled to the plurality of switching elements; and upper and lower data drivers respectively located at upper and lower parts of the OLED display panel, wherein the data lines include an upper data line and a lower data line that are separated from each other, and the cover lines include upper and lower cover lines that are separated from each other.

8 Claims, 21 Drawing Sheets

ORGANIC LIGHT EMITTING DIODE DISPLAY HAVING A PLURALITY OF DATA DRIVERS AND MANUFACTURING METHOD THEREOF

CROSS-REFERENCE TO RELATED APPLICATION

This application claims priority to and the benefit of Korean Patent Application No. 10-2014-0116356 filed in the Korean Intellectual Property Office on Sep. 2, 2014, the entire contents of which are incorporated herein by reference.

BACKGROUND

1. Field

The present disclosure relates to an organic light emitting diode (OLED) display and a manufacturing method thereof.

2. Description of the Related Art

An organic light emitting diode (OLED) display includes two electrodes and an organic emission layer located therebetween, electrons injected from one electrode (e.g., a cathode) and holes injected from the other electrode (e.g., an anode) are combined in the organic emission layer to generate excitons, and the excitons release energy to emit light.

The OLED display includes a plurality of pixels including an OLED consisting of the anode, the cathode, and the organic emission layer, and a plurality of thin film transistors, and a plurality of capacitors are formed to drive the OLED in each pixel.

For the OLED display, an analog driving method in which a current is changed to express gray levels and a digital driving method in which emitting time is controlled by a switching operation of a driving transistor to express gray levels are currently being employed.

Particularly, in the OLED display employing the digital driving method, it is desirable for a driving transistor inside a pixel to stably implement as many subframes as possible in one frame.

Accordingly, in order to minimize a load of a data line, resistance of a data line should be decreased and an RC delay due to a parasite capacitor and the like may be minimized.

For this purpose, since the data drivers are respectively attached to upper and lower parts of an OLED display panel to be separately driven, the load of the data line is seduced by half. The data line inside the OLED display panel is separated into upper and lower parts such that the data signal is separately input to the lower and upper parts of the data line.

Accordingly, when an OS (open/short) test is conducted for the OLED employing the digital driving method where the data line is divided into the upper and lower parts, the OS test is performed to the upper part of the data line and then a panel is typically rotated by 180° to conduct the OS test to the lower part of the data line.

In this case, a tact time of the OS test increases and equipment is necessary to rotate the panel by 180°, thereby increasing a manufacturing cost.

The above information disclosed in this Background section is only for enhancement of understanding of the background of the invention and therefore it may contain information that does not form the prior art that is already known in this country to a person of ordinary skill in the art.

SUMMARY

The present disclosure has been made in an effort to solve the problems of the aforementioned background technology, and thus relates to an organic light emitting diode (OLED) display and a manufacturing method thereof that are capable of reducing a tact time of an OS test and a manufacturing cost.

An organic light emitting diode (OLED) display according to the present disclosure includes: an OLED display panel including a substrate, a plurality of scan lines formed on the substrate, a plurality of data lines crossing the plurality of scan lines, cover lines covering the data lines, a plurality of switching elements coupled to the plurality of scan lines and the plurality of data lines, and a plurality of organic light emitting diodes (OLEDs) coupled to the plurality of switching elements; and upper and lower data drivers respectively located at upper and lower parts of the OLED display panel. The data lines may include an upper data fine and a lower data line that are separated from each other, and the cover fines may include upper and lower cover lines that are separated from each other.

The switching element may include a switching transistor and a driving transistor, and the OLED display panel may employ a digital driving method in which an emitting time is controlled by switching operations of the driving transistor to express gray levels.

The plurality of OLEDs may include an upper OLED located at an upper half of the OLED display panel, and a lower OLED located at a lower half of the OLED display panel.

The upper data driver may transmit a data signal to the upper OLED through the upper data line, and the lower data driver may transmit a data signal to the lower OLED through the lower data line.

The data line and the cover line may be respectively separated by a data separator and a cover separator.

The cover line may be formed of indium tin oxide (ITO).

A manufacturing method of an OLED display according to an exemplary embodiment of the present disclosure may include: forming a plurality of scan lines and a plurality of data lines on a substrate; forming a cover line, which is separated into an upper cover line and a lower cover line, on the data lines; conducting an OS (open/short) test for the data lines; separating the data line into upper and lower data lines by etching the data line that is exposed by a cover separator for separating the upper cover line from the lower cover line; and forming a plurality of switching elements and a plurality of OLEDs respectively coupled to the upper and lower data lines to manufacture an OLED display panel.

The manufacturing method may further include respectively forming upper and lower data drivers at upper and lower parts of the OLED display panel.

The cover line may be formed of amorphous ITO, and the manufacturing method may further include forming the cover line of poly-ITO by performing an annealing process for the cover line formed of amorphous ITO.

An OLED display according to another exemplary embodiment of the present disclosure includes: an OLED display panel including a substrate, a plurality of scan lines formed on the substrate, a plurality of data lines crossing the plurality of scan lines, a plurality of switching elements coupled to the plurality of scan lines and the plurality of data lines, a passivation layer covering the data lines and the switching elements and including a separating hole partially exposing a data line, and a plurality of OLEDs coupled to the plurality of switching elements; and upper and lower data drivers respectively located at upper and lower parts of the OLED display panel. The data line may include upper and lower data lines that are separated from each other, and a border line of the separating hole formed in the passivation layer and a border line of the data separator may coincide with each other.

The switching elements may include a switching transistor and a driving transistor, and the OLED display panel may employ a digital driving method in which an emitting time is controlled by switching operations of the driving transistor to express gray levels.

The OLED display may further include pixel cover members for covering lateral sides of the upper and lower data lines that are exposed by the data separator.

The OLED may include: a pixel electrode formed on the passivation layer; an organic emission layer formed on the pixel electrode; and a common electrode formed on the organic emission layer, and the pixel cover members may be formed of the same material as the pixel electrode.

In addition, a manufacturing method of an OLED display according to another exemplary embodiment of the present disclosure may include: forming a plurality of scan lines and a plurality of data lines on a substrate; conducting an OS test for the data lines; forming a passivation layer having a separating hole partially exposing a data line on the data line; etching and then separating the data line exposed by the separating hole into an upper data line and a lower data line; and forming a plurality of switching elements and a plurality of OLEDs respectively coupled to the upper and lower data lines to manufacture an OLED display panel.

The manufacturing method may further include forming pixel cover members for covering lateral sides of the upper and lower data lines.

The pixel cover members may be formed of the same material as a pixel electrode of the OLED.

The manufacturing method may further include respectively forming upper and lower data drivers at upper and lower parts of the OLED display panel.

According to embodiments of the present disclosure, the lower and upper cover lines are formed to be separated by the cover separator without separating the data line and the OS test is conducted, such that measurement and inspection can be performed with only a single scan in the OS test.

In addition, subsequently, the data line partially exposed by the cover separator is etched to be separated into the lower data line and the upper data line, thereby minimizing the load of the data line in the digital driving method.

DETAILED DESCRIPTION

Figure 1:
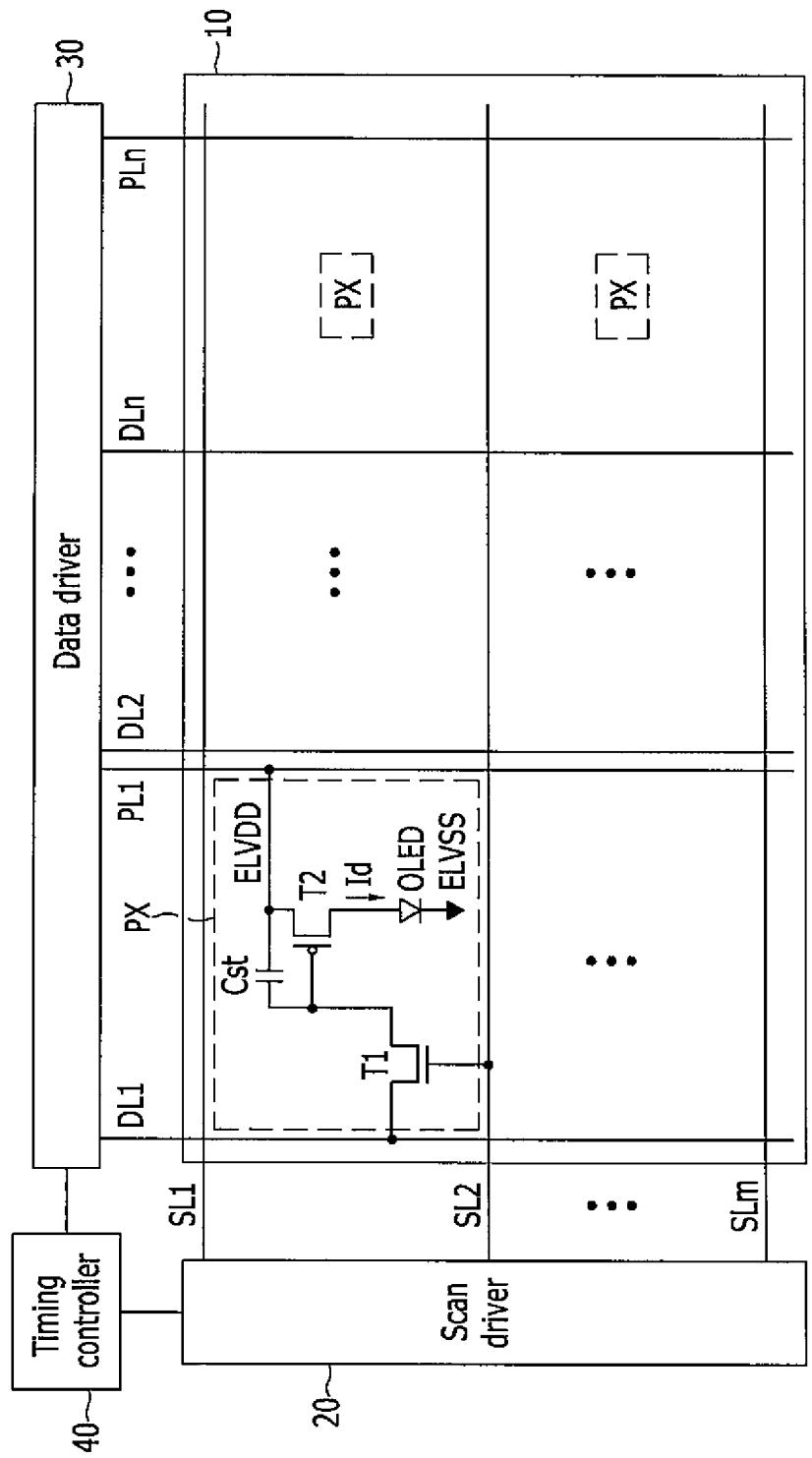
FIG. 1 is a schematic diagram of an organic light emitting diode (OLED) display according to an exemplary embodiment of the present disclosure.

The present disclosure will be described more fully hereinafter with reference to the accompanying drawings, in which exemplary embodiments of the invention are shown.

As those skilled in the art would realize, the described embodiments may be modified in various different ways, all without departing from the spirit or scope of the present disclosure.

Parts that are irrelevant to the description will be omitted to clearly describe the present disclosure, and the same or similar constituent elements will be designated by the same reference numerals throughout the specification.

Further, in the drawings, size and thickness of each element are arbitrarily illustrated for ease of description, and the present disclosure is not necessarily limited to those illustrated in the drawings.

In the drawings, the thickness of layers, films, panels, regions, etc., are exaggerated for clarity.

In the drawings, for ease of description, the thicknesses of some layers and regions are exaggerated.

It will be understood that when an element such as a layer, film, region, or substrate is referred to as being "on" another element, it can be directly on the other element or intervening elements may also be present. Further, relative terms such "upper" and "lower" refer to locations of elements based on the orientation shown in the drawings, but it will be appreciated that these designations still apply to differentiate elements even when embodiments of the present invention are oriented differently than in the drawings.

In addition, unless explicitly described to the contrary, the word "comprise" and variations such as "comprises" or "comprising" will be understood to imply the inclusion of stated elements but not the exclusion of any other elements.

Further, in the specification, the word "on" means positioning on or below the object portion, and does not necessarily mean positioning on the upper side of the object portion based on a gravity direction.

In the accompanying drawings, an active matrix (AM) type of organic light emitting diode (OLED) display is illustrated to have a 2Tr–1 Cap structure in which two transistors (TFTs) and one capacitor are provided for one pixel, but the present disclosure is not limited thereto.

Thus, in the OLED display, each pixel may be provided with a plurality of transistors and at least one capacitor, and may be formed to have various structures by further forming additional wires or omitting existing wires.

In this case, the pixel is a minimum unit for displaying an image, and the OLED display displays the image through the plurality of pixels.

The OLED display according to the exemplary embodiment of the present disclosure will now be described in detail with reference to FIGS. 1 to 6.

FIG. 1 is a schematic diagram of an organic light emitting diode (OLED) display according to an exemplary embodiment of the present disclosure.

As shown in FIG. 1, the OLED display according to the exemplary embodiment of the present disclosure includes an OLED display panel 10, a scan driver 20, a data driver 30, and a timing controller 40.

The OLED display panel 10 includes a plurality of scan lines SL1 to SLm, a plurality of data lines DL1 to DLn, and a plurality of driving voltage lines PL1 to PLn that cross each other to define each pixel PX.

The plurality of scan lines SL1 to SLm substantially extend in a row direction and are substantially parallel to each other, and the plurality of data lines DL1 to DLn and the plurality of driving voltage lines PL1 to PLn substantially extend in a column direction and are substantially parallel to each other.

Each pixel PX includes a switching transistor T1 that is respectively coupled to the plurality of scan lines SL1 to SLm and the plurality of data lines DL1 to DLn, a storage capacitor Cst and a driving transistor T2 that are respectively coupled between the plurality of switching transistors T1 and the plurality of driving voltage lines PL1 to PLn, and an organic light emitting diode (OLED) that is coupled to the driving transistor T2.

The scan driver 20 applies a scan signal to the plurality of scan lines SL1 to SLm, and the data driver 30 applies a data signal to the plurality of data lines DL1 to DLn.

The switching transistor T1 includes a control terminal, an input terminal, and an output terminal such that the control terminal is coupled to the scan lines SL1 to SLm, the input terminal is coupled to the data lines DL1 to DLn, and the output terminal is coupled to the driving transistor T2.

In response to the scan signal applied to the scan lines SL1 to SLm, the switching transistor T1 transmits the data signal applied to the data lines DL1 to DLn to the driving transistor T2.

The driving transistor T2 also includes a control terminal, an input terminal, and an output terminal such that the control terminal is coupled to the switching transistor T1, the input terminal is coupled to the driving voltage lines PL1 to PLn, and the output terminal is coupled to the OLED.

The OLED includes an anode coupled to the output terminal of the driving transistor T2, and a cathode coupled to a common voltage ELVSS.

When the switching transistor T1 is turned on according to the scan signal, the data signal is charged to the storage capacitor Cst and the control terminal of the driving transistor T2, and as a result, the driving transistor T2 is turned on to apply the driving voltage ELVDD of the driving voltage lines PL1 to PLn to the OLED, thereby allowing the OLED to emit light.

The timing controller 40 receives image signals and various control signals from an external system, and generates RGB signals, a data control signal, and a scan control signal to transmit them to the scan driver 20 and the data driver 30.

Figure 2:
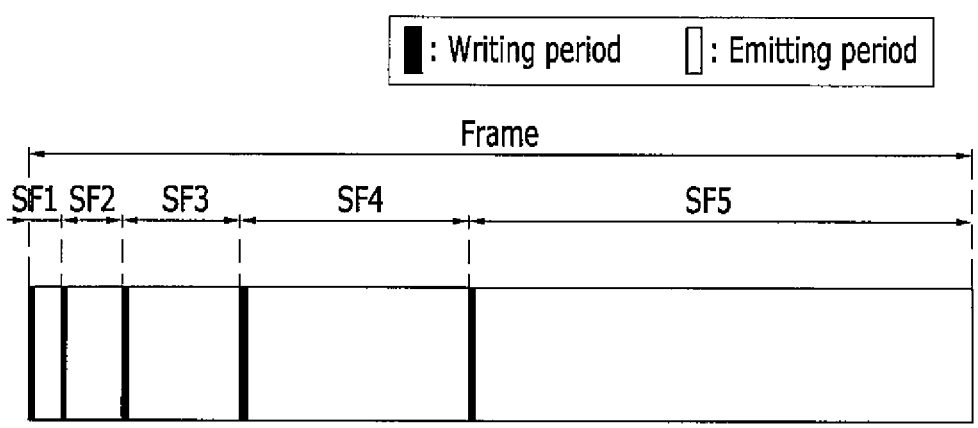
FIG. 2 is a drawing for describing a digital driving method of the OLED display according to the exemplary embodiment of the present disclosure.

FIG. 2 is a drawing for describing a digital driving method of the OLED display according to the exemplary embodiment of the present disclosure.

As shown in FIG. 2, in the digital driving method, gray levels of the image can be displayed for each frame that consists of a plurality of sub-fields.

In this case, each sub-field may include a writing period for inputting the data signal to each pixel and an emitting period for allowing the OLED to actually emit light, and may further include an erasing period for stopping the light emission of the OLED.

For example, when 32 gray levels are used to display the image, one frame may be divided into first to fifth sub-fields SF1 to SF5, as shown in FIG. 2, and the first to fifth sub-fields SF1 to SF5 are respectively subdivided into the writing period and the emitting period.

In addition, a length of the emitting period may be adjusted to set a binary weight of the corresponding sub-field.

For example, a weight value of the first sub-field SF1 is set to $2^0$ and a weight value of the second sub-field SF2 is set to $2^1$, such that the weight value of each sub-field can be determined to be increased in a ratio of $2^n$ (n=0, 1, 2, 3, 4).

The frame having such a structure may implement the image with a total of 32 gray levels ($=2^5$).

For example, when implementing the image of 32 gray levels, all of the sub-fields from the first sub-field SF1 to the fifth sub-field SF5 are on.

That is, 32 gray levels can be displayed by supplying the data signal for turning on the OLED to the data line for the respective writing periods of the first sub-field SF1 to the fifth sub-field SF5 and allowing the OLED to emit light for the respective emitting periods following the respective writing periods.

Alternatively, when the image of 10 gray levels is implemented, the second sub-field SF2 having a weight value of 2 ($=2^1$) and the fourth sub-field SF4 having a weight value of 8 ($=2^3$) need to be on.

In other words, by supplying the data signal for turning on the OLED to the data line for the respective writing periods of the second and fourth sub-fields SF2 and SF4 and the data signal for turning off the OLED to the data line for the respective writing periods of the first, third, and fifth sub-fields SF1, SF3, and SF5, the OLED may be allowed to emit light for the respective emitting periods of the second and fourth sub-fields SF2 and SF4 while not being allowed to emit light for the respective emitting periods of the first, third, and fifth sub-fields SF1, SF3, and SF5, thereby displaying the image at 10 gray levels.

As described above, since the data signal applied to each pixel has two voltage values for turning on or turning off the OLED, such a time-division driving method is referred to as the digital driving method.

In FIG. 2, 5-bit driving in which one frame consists of five sub-fields is exemplarily described, but the number of sub-fields included in one frame can be variously changed.

Further, in FIG. 2, an example in which the sub-fields are sequentially arranged in an increasing order of weight values in one frame is illustrated, but the sub-fields may be sequentially arranged in a decreasing order of weight values in one frame or may be arranged irrespective of weight values.

Figure 3:
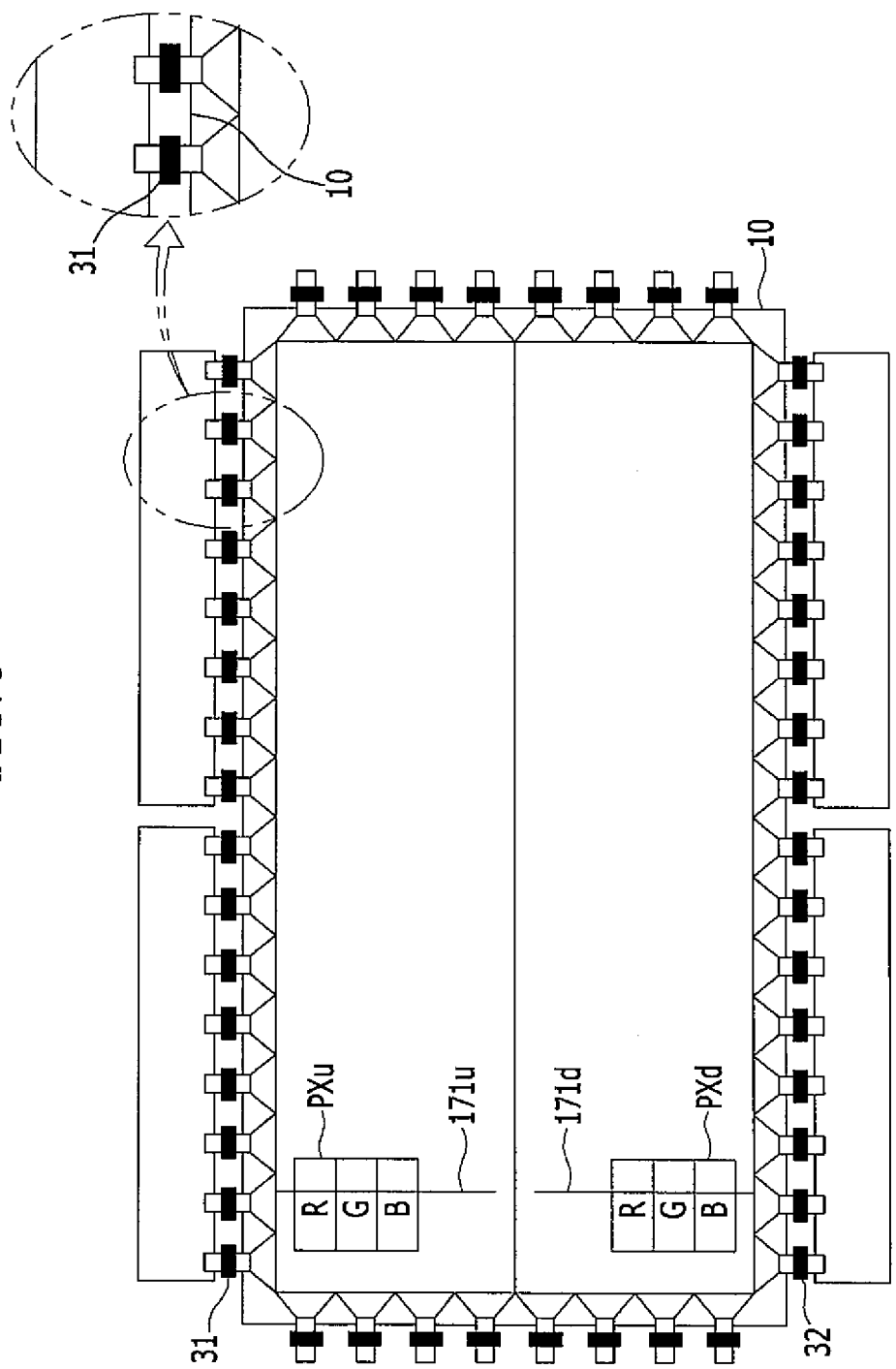
FIG. 3 is a drawing for illustrating data drivers separately located at upper and lower parts of an OLED display panel of the OLED display according to the exemplary embodiment of the present disclosure.

FIG. 3 is a drawing for illustrating data drivers separately located at upper and lower parts of an OLED display panel of the OLED display according to the exemplary embodiment of the present disclosure.

As shown in FIG. 3, an upper data driver 31 and a lower data driver 32 are respectively attached to upper and lower parts of the OLED display panel 10.

A plurality of pixels PX formed in the OLED display panel 10 include an upper pixel PXu that is located at an upper half of the OLED display panel 10, and a lower pixel PXd that is located at a lower half of the OLED display panel 10.

In order to emit light, an upper OLED OLEDu is formed in the upper pixel PXu and a lower OLED OLEDd is formed in the lower pixel PXd.

A data line 171 is divided into an upper data line 171u for transmitting the data signal to the upper OLED OLEDu of the upper pixel PXu, and a lower data line 171d for transmitting the data signal to the lower OLED OLEDd of the lower pixel PXd.

Accordingly, the upper data driver 31 transmits the data signal to the upper OLED of the upper pixel PXu through the upper data line 171u, and the lower data driver 32 transmits the data signal to the lower OLED of the lower pixel PXd through the lower data line 171d.

As described above, since the plurality of pixels are separately driven by the OLED of the upper pixel PXu and the lower OLED of the lower pixel PXd, resistance of the data line 171 is reduced to decrease the load of the data line 171 by half.

A detailed structure of the pixel of the OLED display illustrated in FIG. 1 will now be described with reference to FIGS. 4 to 6 along with FIG. 1.

Figure 4:
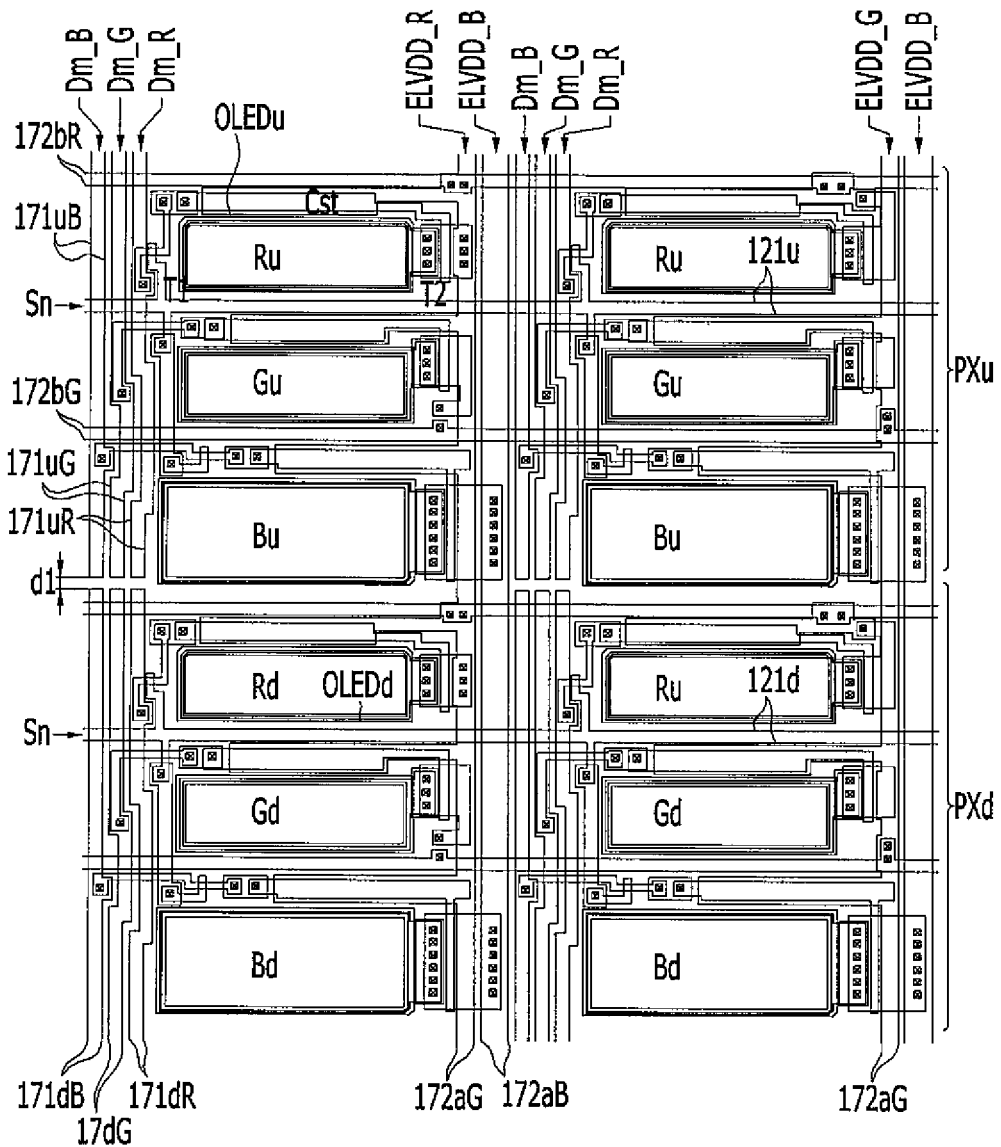
FIG. 4 is a layout view of a plurality of pixels of the OLED display according to the exemplary embodiment of the present disclosure.

FIG. 4 is a layout view of a plurality of pixels of the OLED display according to the exemplary embodiment of the present disclosure.

As shown in FIG. 4, in the OLED display according to the exemplary embodiment of the present disclosure, the plurality of pixels PX include the upper pixel PXu and the lower pixel PXd.

For ease of description, six upper pixels PXu and six lower pixels PXd are illustrated in FIG. 4.

The upper pixel PXu includes an upper red pixel Ru, an upper green pixel Gu, and an upper blue pixel Bu that are oriented in the column direction, and the lower pixel PXd includes a lower red pixel Rd, a lower green pixel Gd, and a lower blue pixel Bd that are oriented in the column direction.

The upper pixel PXu includes an upper scan line 121u that is formed along a row direction to apply a scan signal Sn, and an upper data line 171u that crosses the upper scan line 121u to apply a data signal Dm to the upper pixel PXu.

The lower pixel PXd includes a lower scan line 121d that is formed along the row direction to apply the scan signal Sn, and a lower data line 171d that crosses the lower scan line 121d to apply the data signal Dm to the lower pixel PXd.

The upper and lower data lines 171u and 171d are separated by a data separator d1.

Accordingly, since the upper OLED of the upper pixel PXu receives the data signal from the upper data line 171u and the lower OLED of the lower pixel PXd receives the data signal from the lower data line 171d, resistance of the entire data line 171 is reduced to decrease the load of data line 171 by half.

A driving voltage line 172 for transmitting the driving voltage ELVDD is coupled to both the upper pixel PXu and the lower pixel PXd.

The data signal Dm includes a red data signal Dm_R, a green data signal Dm_G, and a blue data signal Dm_B, the upper data line 171u includes an upper red data line 171uR through which the red data signal Dm_R is transmitted, an upper green data line 171uG through which the green data signal Dm_G is transmitted, and an upper blue data line 171uB through which the blue data signal Dm_B is transmitted, and the lower data line 171d includes a lower red data line 171dR through which the red data signal Dm_R is transmitted, a lower green data line 171dG through which the green data signal Dm_G is transmitted, and a lower blue data line 171dB through which the blue data signal Dm_B is transmitted.

The driving voltage line 172 includes a vertical driving voltage line 172a that is oriented parallel to the data line 171, and a horizontal driving voltage line 172b that is oriented parallel to the scan line 121.

The vertical driving voltage line 172a includes a red vertical driving voltage line 172aR through which a red driving voltage ELVDD_R is transmitted, a green vertical driving voltage line 172aG through which a green driving voltage ELVDD_G is transmitted, and a blue vertical driving voltage line 172aB through which a blue driving voltage ELVDD_B is transmitted, and the horizontal driving voltage line 172b includes a red horizontal driving voltage line 172bR coupled to the red vertical driving voltage line 172aR and a green horizontal driving voltage line 172bG coupled to the green vertical driving voltage line 172aG.

In addition, the switching transistor T1, the driving transistor T2, the storage capacitor Cst, and the OLED are formed in each pixel.

A detailed structure of one pixel will now be described with reference to FIG. 4 and FIGS. 5 to 7.

Figure 5:
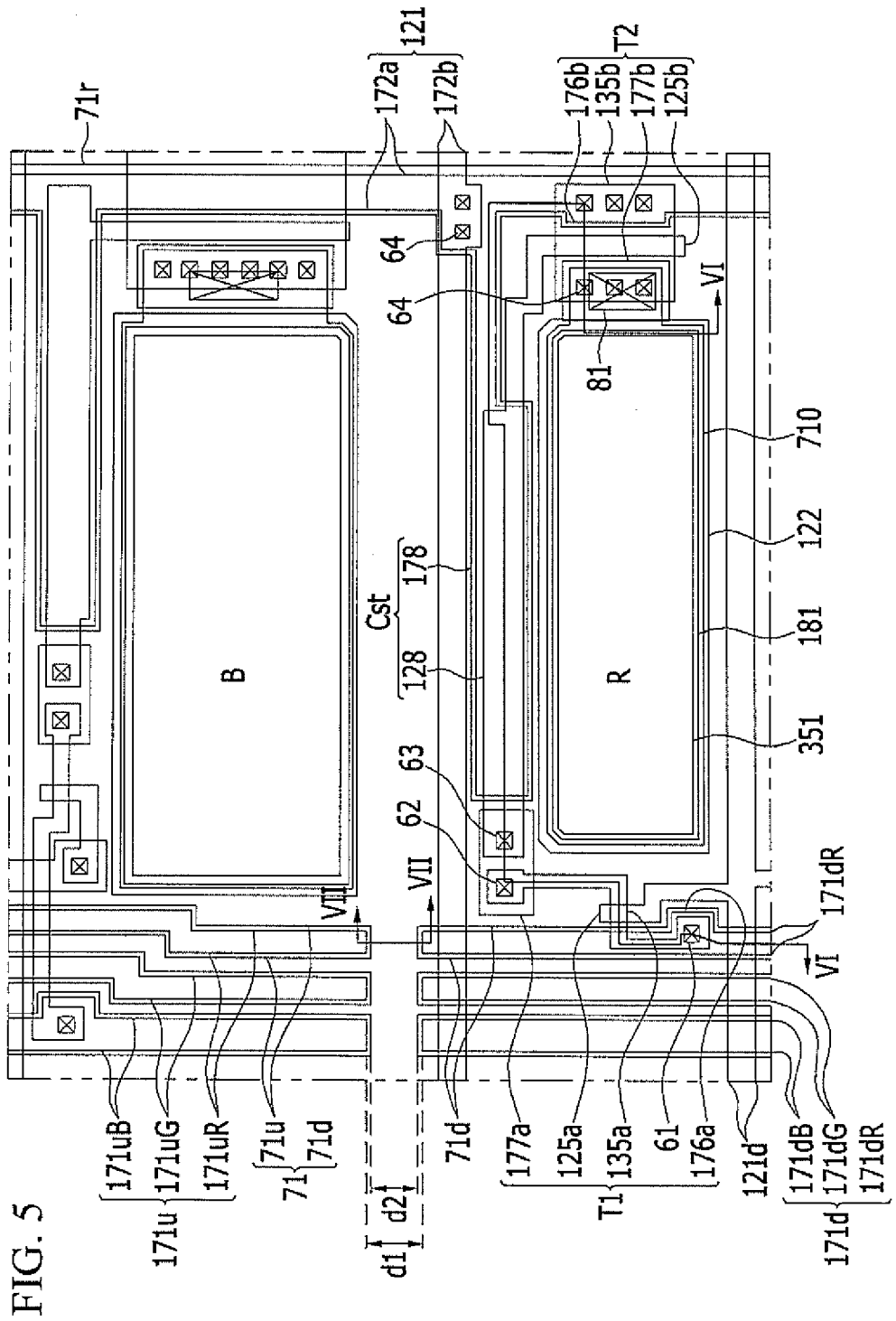
FIG. 5 is a layout view of two adjacent pixels of the OLED display according to the exemplary embodiment of the present disclosure.
Figure 6:
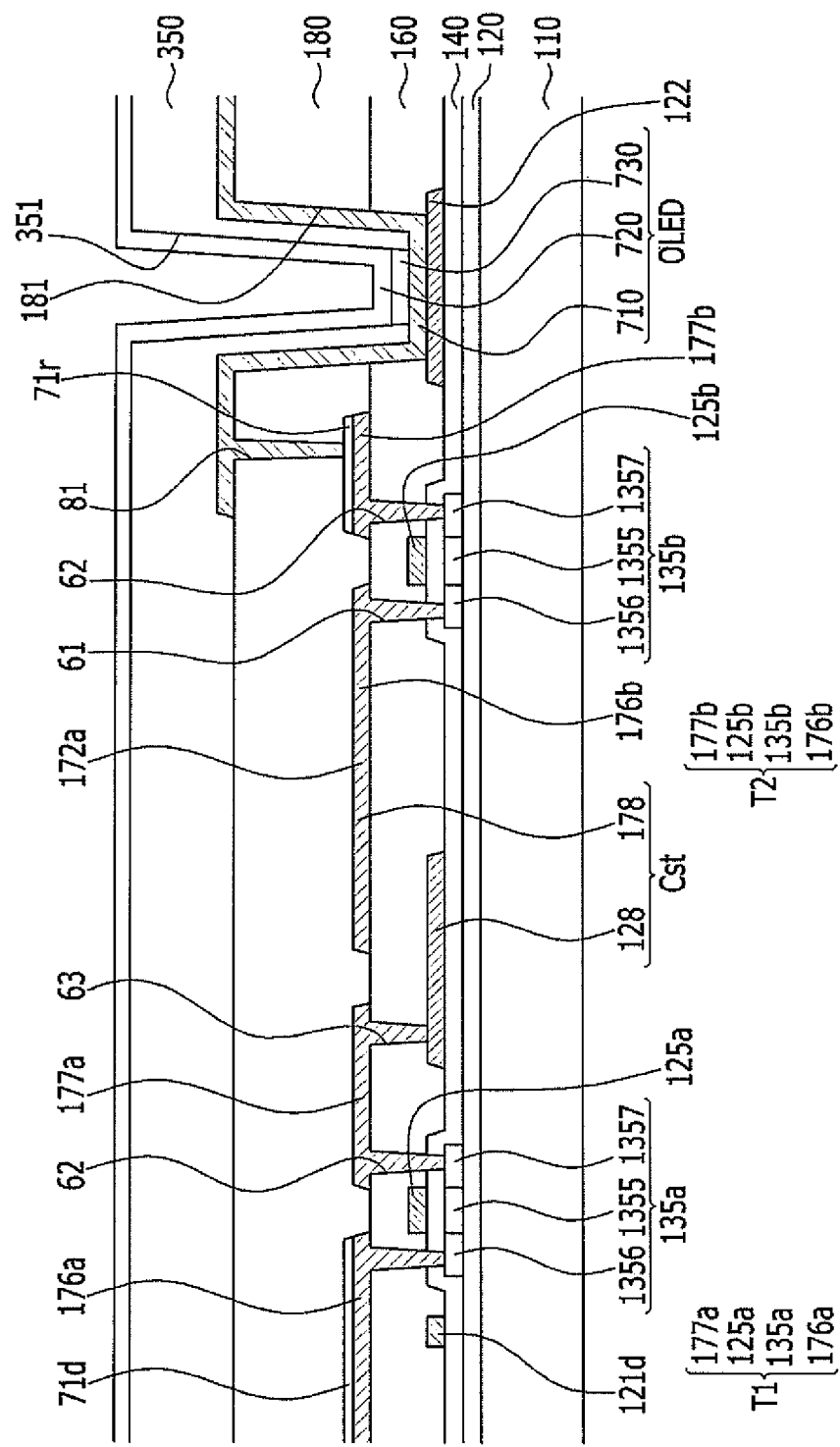
FIG. 6 is a cross-sectional view of FIG. 5 taken along the line VI-VI.
Figure 7:
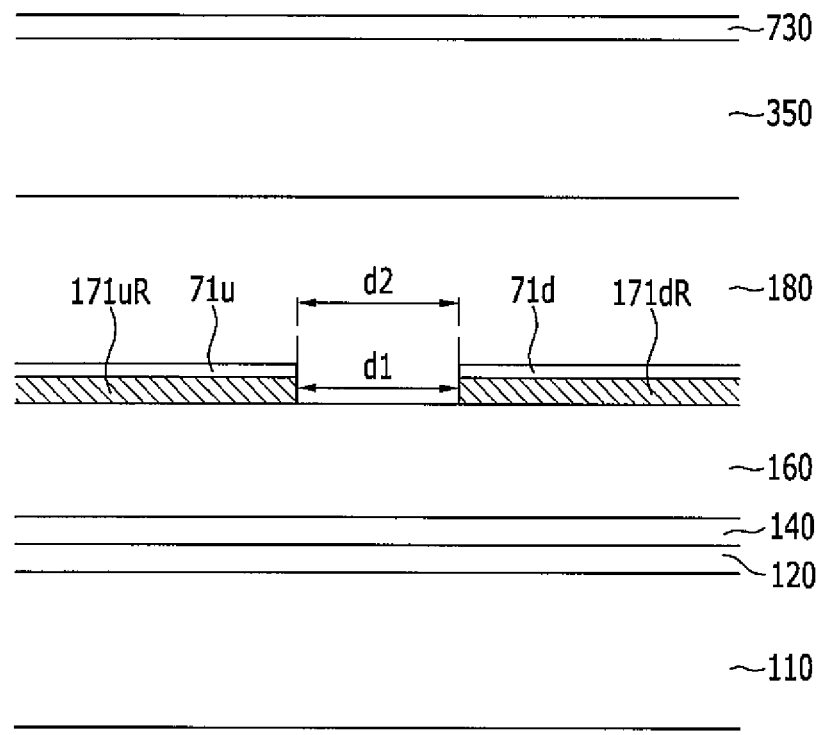
FIG. 7 is a cross-sectional view of FIG. 5 taken along the line VII-VII.

FIG. 5 is a layout view of two adjacent pixels of the OLED display according to the exemplary embodiment of the present disclosure, FIG. 6 is a cross-sectional view of FIG. 5 taken along the line VI-VI, and FIG. 7 is a cross-sectional view of FIG. 5 taken along the line VII-VII.

In FIG. 5, the upper blue pixel and the lower red pixel are illustrated, and a description will be made based on the lower red pixel.

A specific planar structure of the OLED display according to the exemplary embodiment of the present disclosure will be described in detail with reference to FIG. 5 first, and a specific cross-sectional structure will be described in detail with reference to FIGS. 6 and 7.

First, as shown in FIG. 5, a switching transistor T1 of the lower red pixel includes a switching semiconductor layer 135a, a switching gate electrode 125a, a switching source electrode 176a, and a switching drain electrode 177a.

The switching gate electrode 125a is a part of the lower scan line 121d upwardly protruding therefrom, and the switching source electrode 176a is a part of the lower red data line 171dR.

The lower and upper data lines 171d and 171u are separated by the data separator d1. A lower cover line 71d overlaps to cover the lower data line 171d, and an upper cover line 71u overlaps to cover the upper data line 171u.

The cover line 71 including the lower and upper cover lines 71d and 71u respectively cover the lower and upper data lines 171d and 171u.

The lower and upper cover lines 71d and 71u are formed to be separated from the cover separator d2 without separating the data line 171 and an OS test is conducted such that measurement and inspection are performed with only a single scan in the OS test, and the data line partially exposed by the cover separator d2 is etched to be separated into the lower data line 171d and the upper data line 171u, thereby minimizing the load of the data line in the digital driving method.

A driving transistor T2 includes a driving semiconductor layer 135b, a driving gate electrode 125b, a driving source electrode 176b, and a driving drain electrode 177b.

The driving source electrode 176b is a part of the vertical driving voltage line 172a, and the driving drain electrode 177b is coupled to a pixel electrode 710 through a contact hole 81.

The storage capacitor Cst includes a first storage capacitor plate 128 and a second storage capacitor plate 178 that overlap each other.

The first storage capacitor plate 128 is a part of the driving gate electrode 125b extending therefrom, and the second storage capacitor plate 178 is a part of the vertical driving voltage line 172a extending therefrom.

A storage capacitance is determined by charges stored in the storage capacitor Cst and a voltage difference between the storage capacitor plates 128 and 178.

Thus, the storage capacitor Cst stores the storage capacitance corresponding to a difference between the driving voltage ELVDD transmitted to the second storage capacitor plate 178 through the driving voltage line 172 and a gate voltage of the driving gate electrode 125b.

Next, the specific cross-sectional structure will be described in detail with reference to FIGS. 6 and 7.

As shown in FIGS. 6 and 7, a substrate 110 of the OLED display according to the exemplary embodiment of the present disclosure may be an insulating substrate that is formed of glass, quartz, ceramic, plastic, etc.

A buffer layer 120 may be formed on the substrate 110.

The buffer layer 120 may be formed to have a single layer of a silicon nitride ($SiN_x$) or a double layer structure in which a silicon nitride ($SiN_x$) and a silicon oxide ($SiO_x$) are laminated.

The buffer layer 120 not only prevents unnecessary materials such as impurities or moisture from permeating, but also serves to planarize a surface.

A switching semiconductor layer 135a and a driving semiconductor layer 135b are located on the buffer layer 120 to be separated from each other.

The semiconductor layers 135a and 135b may be formed of polysilicon or an oxide semiconductor, and the oxide semiconductor may include one of oxides based on titanium (Ti), hafnium (Hf), zirconium (Zr), aluminum (Al), tantalum (Ta), germanium (Ge), zinc (Zn), gallium (Ga), tin (Sr), or indium (In), and complex oxides thereof such as indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O).

When the semiconductor layers 135a and 135b are formed of the oxide semiconductor, an additional protective layer may be added to protect the oxide semiconductor that is vulnerable to an external environment such as high temperature and the like.

The semiconductor layers 135a and 135b include a channel region where no impurity is doped, and source and drain regions that are formed at lateral sides of the channel region where impurities are doped.

In this case, these impurities may be dependent upon types of the transistors, and n-type impurities or p-type impurities may be accordingly applicable.

The switching semiconductor layer 135a and the driving semiconductor layer 135b are respectively divided into a channel region 1355, and a source region 1356 and a drain region 1357 that are respectively formed at the lateral sides of the channel region 1355.

The channel regions 1355 of the switching semiconductor layer 135a and the driving semiconductor layer 135b may include polysilicon in which no impurity is doped, that is, an intrinsic semiconductor, and the source and drain regions 1356 and 1357 of the switching semiconductor layer 135a and the driving semiconductor layer 135b may include polysilicon in which conductive impurities are doped, that is, impurity semiconductors.

A gate insulation layer 140 is formed on the switching semiconductor layer 135a and the driving semiconductor layer 135b.

The gate insulation layer 140 may be a single layer or multiple layers including at least one of a silicon nitride and a silicon oxide.

The lower scan line 121d, the driving gate electrode 125b, a reflective layer 122, and the first storage capacitor plate 128 are formed on the gate insulating layer 140.

The lower scan line 121d is elongated in a horizontal direction to transmit the scan signal, and includes the switching gate electrode 125a that protrudes toward the switching semiconductor layer 135a from the lower scan line 121d.

The driving gate electrode 125b protrudes toward the driving semiconductor layer 135b from the first storage capacitor plate 128.

The switching gate electrode 125a and the driving gate electrode 125b respectively overlap the channel region 1355.

An interlayer insulating layer 160 is formed on the lower scan line 121d, the driving gate electrode 125b, and the first storage capacitor plate 128.

The interlayer insulating layer 160 may be formed of a silicon nitride, a silicon oxide, etc., as is the gate insulating layer 140.

A source contact hole 61 and a drain contact hole 62 are respectively formed in the interlayer insulating layer 160 and the gate insulating layer 140 to expose the source region 1356 and the drain region 1357, and a storage contact hole 63 is formed to partially expose the first storage capacitor plate 128.

On the interlayer insulating layer 160, the lower data line 171d including the switching source electrode 176a, the vertical driving voltage line 172a including the driving source electrode 176b and the second storage capacitor plate 178, and the switching drain electrode 177a and the driving drain electrode 177b that are coupled to the first storage capacitor plate 128 are formed.

The switching source electrode 176a protrudes toward the switching semiconductor layer 135a from the lower data line 171d, and the driving source electrode 176b protrudes toward the driving semiconductor layer 135b from the vertical driving voltage line 172a.

The switching source electrode 176a and the driving source electrode 176b are respectively coupled to the source region 1356 through the source contact hole 61.

The switching drain electrode 177a faces the switching source electrode 176a, the driving drain electrode 177b faces the driving source electrode 176b, and the switching drain electrode 177a and the driving drain electrode 177b are respectively coupled to the drain region 1357 through the drain contact hole 62.

The switching drain electrode 177a is elongated to be electrically coupled to the first storage capacitor plate 128 and the driving gate electrode 125b through the contact hole 63 that is formed in the interlayer insulating layer 160.

The second storage capacitor plate 178 protrudes from the driving voltage line 172 to overlap the first storage capacitor plate 128.

Accordingly, the first and second storage capacitor plates 128 and 178 form a storage capacitor Cst using the interlayer insulating layer 160 as a dielectric material therebetween.

The upper cover line 71u and the lower cover line 71d are respectively formed on the upper data line 171u and the lower data line 171d.

The lower and upper data lines 171d and 171u are separated by the data separator d1, and the lower cover line 71d and the upper cover line 71u are separated by the cover separator d2.

In addition, a driving cover line 71r is formed on the vertical driving voltage line 172a.

The cover line 71 may be formed of a transparent conductive material such as indium tin oxide (ITO), indium zinc oxide (IZO), zinc oxide (ZnO), indium oxide ($In_2O_3$), etc.

A passivation layer 180 is formed on the lower cover line 71d, the driving source electrode 176b, and the driving cover line 71r.

A first pixel opening 181 is formed in the passivation layer 180 and the interlayer insulating layer 160 to expose the reflective layer 122.

The pixel electrode 710 is formed on the reflective layer 122 and the passivation layer 180 that are exposed by the first pixel opening 181, and the pixel electrode 710 may be formed of a transparent conductive material such as indium tin oxide (ITO), indium zinc oxide (IZO), zinc oxide (ZnO), indium oxide ($In_2O_3$), etc.

The pixel electrode 710 is electrically coupled to the driving drain electrode 177b of the driving transistor T2 through the contact hole 81 formed in the passivation layer 180 such that it becomes an anode of the OLED.

A pixel definition layer 350 is formed on edge portions of the passivation layer 180 and the pixel electrode 710.

The pixel definition layer 350 includes a second pixel opening 351 that exposes the pixel electrode 710.

The pixel definition layer 350 may be formed to include a polyacrylate-based resin or a polyimide-based resin, and a silica-based inorganic material.

An organic emission layer 720 is formed in the second pixel opening 351 of the pixel definition layer 350.

The organic emission layer 720 is formed to have multiple layers including one or more of an emission layer, a hole injection layer (HIL), a hole transporting layer (HTL), an electron transporting layer (ETL), and an electron injection layer (EIL).

When the organic emission layer 720 includes all of them, the hole-injection layer is located on the pixel electrode 710 serving as the anode, and the hole-transporting layer, the emission layer, the electron-transporting layer, and the electron-injection layer may be sequentially laminated thereon.

The organic emission layer 720 may include a red organic emission layer emitting red light, a green organic emission layer emitting green light, and a blue organic emission layer emitting blue light. The red organic emission layer, the green organic emission layer, and the blue organic emission layer are respectively formed on a red pixel, a green pixel, and a blue pixel to implement a color image.

Further, the red organic emission layer, the green organic emission layer, and the blue organic emission layer are integrally laminated on the organic emission layer 720 together with the red pixel, the green pixel, and the blue pixel to respectively form a red color filter, a green color filter, and a blue color filter in each pixel so as to implement a color image.

Alternatively, a white organic emission layer emitting white light is formed on all of the red pixel, the green pixel, and the blue pixel, and a red color filter, a green color filter, and a blue color filter are respectively formed for every pixel to implement a color image.

When the color image is implemented by using the white organic emission layer and the color filter, a deposition mask for depositing the red organic emission layer, the green organic emission layer, and the blue organic emission layer on individual pixels, that is, the red pixel, the green pixel, and the blue pixel, is not required.

The white organic emission layer described in another exemplary embodiment may be formed to have a single organic emission layer, and may further include a configuration in which a plurality of organic emission layers are laminated to emit white light.

For example, a configuration in which at least one yellow organic emission layer and at least one blue organic emission layer are combined to emit white light, a configuration in which at least one cyan organic emission layer and at least one red organic emission layer are combined to emit white light, and a configuration in which at least one magenta organic emission layer and at least one green organic emission layer are combined to emit white light may be further included.

A common electrode 730 is formed on the pixel definition layer 350 and the organic emission layer 720.

The common electrode 730 may be made of a transparent conductive material such as indium tin oxide (ITO), indium zinc oxide (IZO), zinc oxide (ZnO), indium oxide ($In_2O_3$), etc., or a reflective metal such as lithium, calcium, lithium fluoride/calcium, lithium fluoride/aluminum, aluminum, silver, magnesium, gold, etc.

In one embodiment, the common electrode 730 becomes a cathode of the OLED.

The pixel electrode 710, the organic emission layer 720, and the common electrode 730 form the OLED.

A manufacturing method of an OLED display according to an exemplary embodiment of the present disclosure will now be described in detail with reference to FIGS. 8 to 14 and FIGS. 5 to 7.

Figure 8:
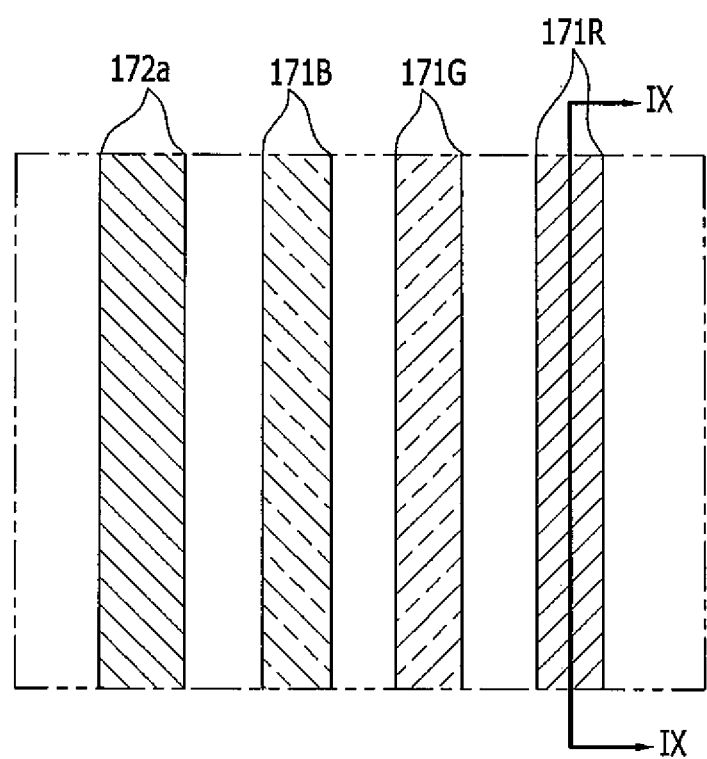
FIG. 8 is a top plan view of a step for forming data lines and a driving voltage line.
Figure 9:
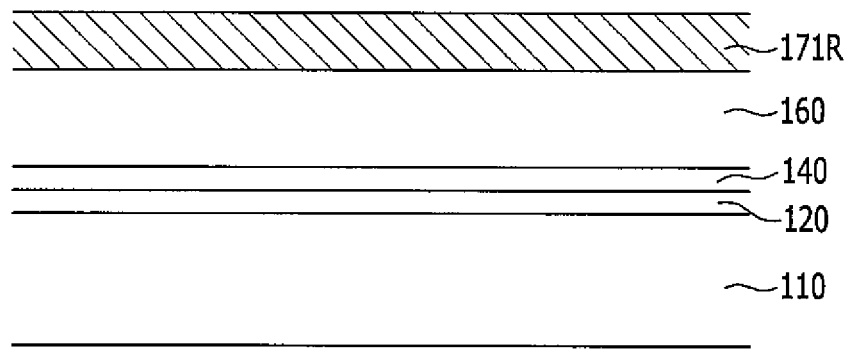
FIG. 9 is a cross-sectional view of FIG. 8 taken along the line IX-IX.
Figure 10:
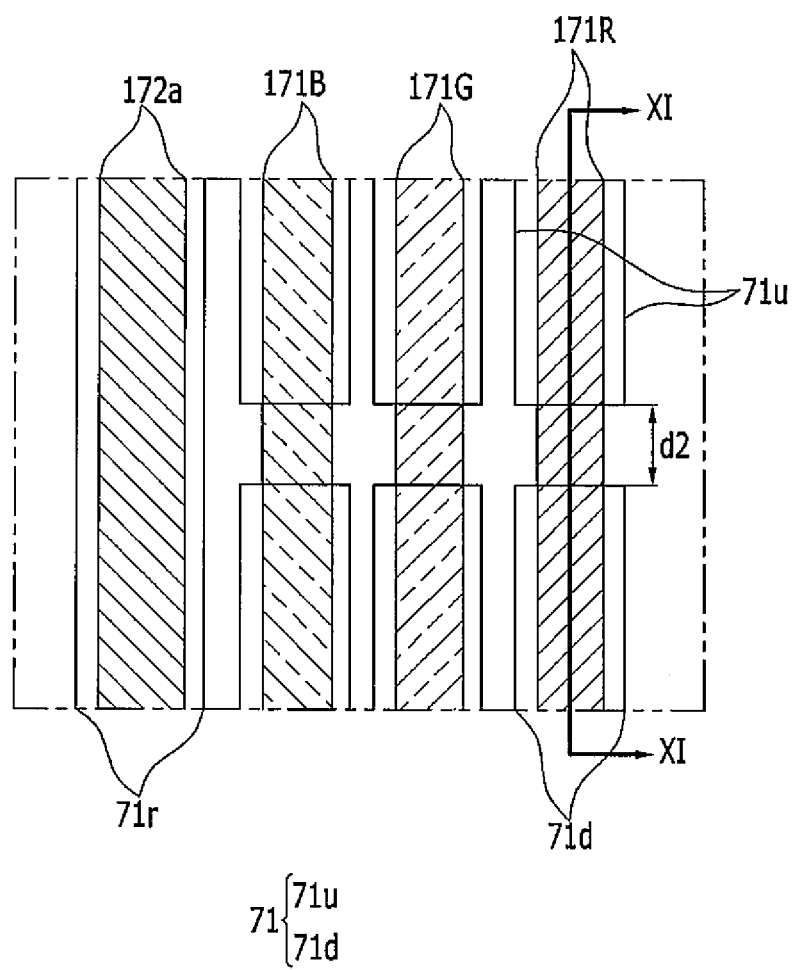
FIG. 10 is a top plan view of a step for forming a cover line on the data lines and the driving voltage line.
Figure 11:
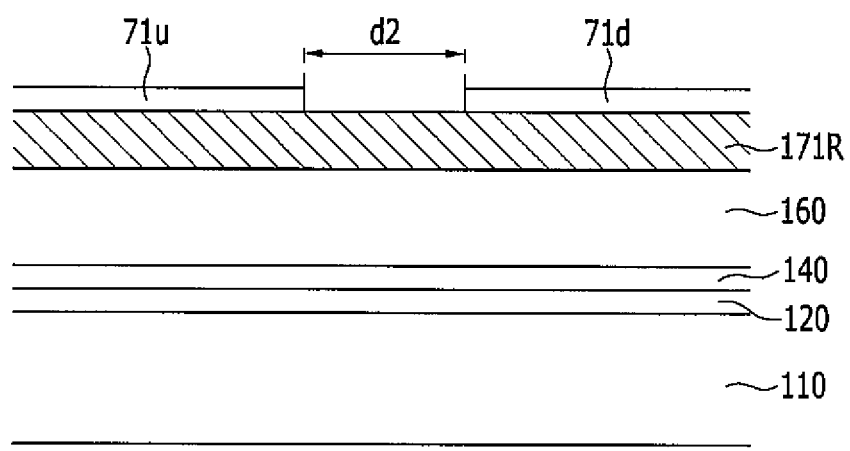
FIG. 11 is a cross-sectional view of FIG. 10 taken along the line XI-XI.
Figure 12:
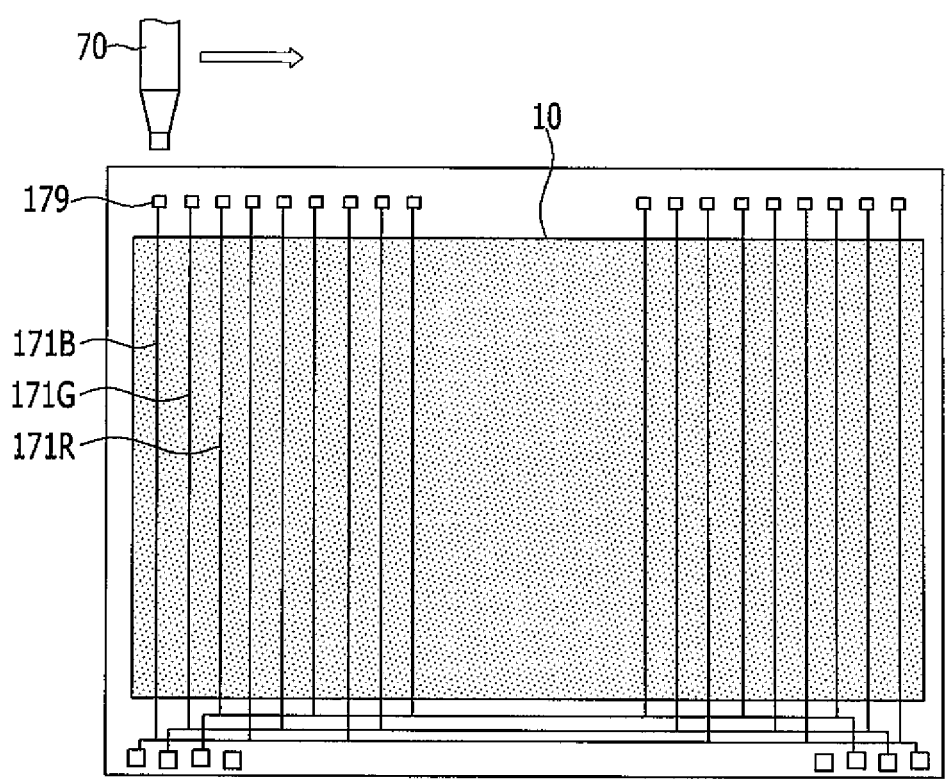
FIG. 12 is a drawing for describing a step of conducting an OS test for the data lines.
Figure 13:
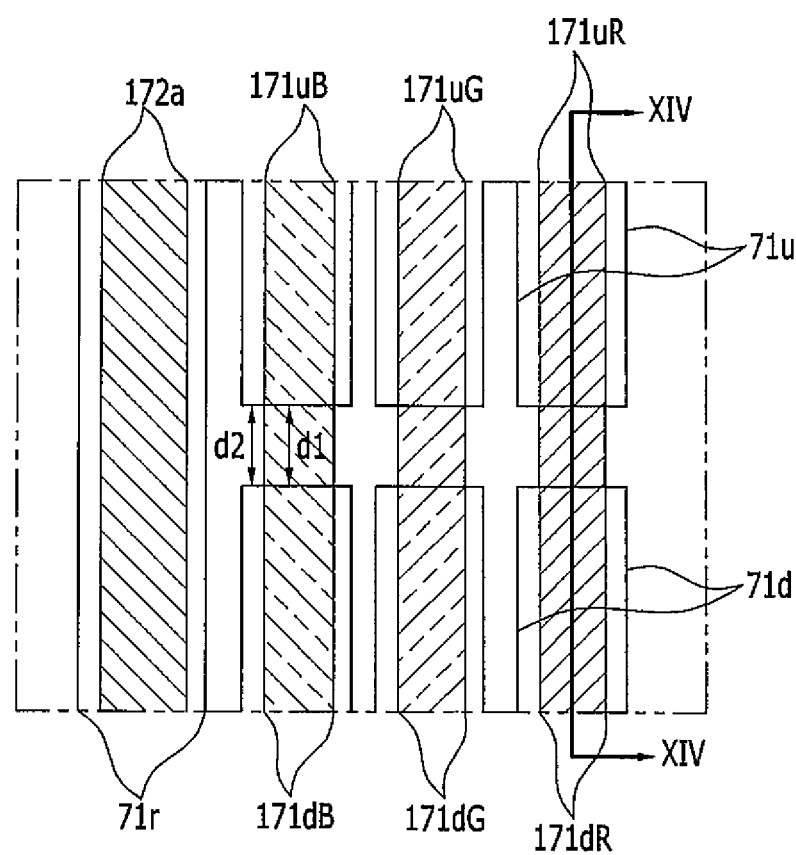
FIG. 13 is a top plan view of a step in which the data lines are separated into lower data lines and upper data lines using the cover line as an etching mask.
Figure 14:
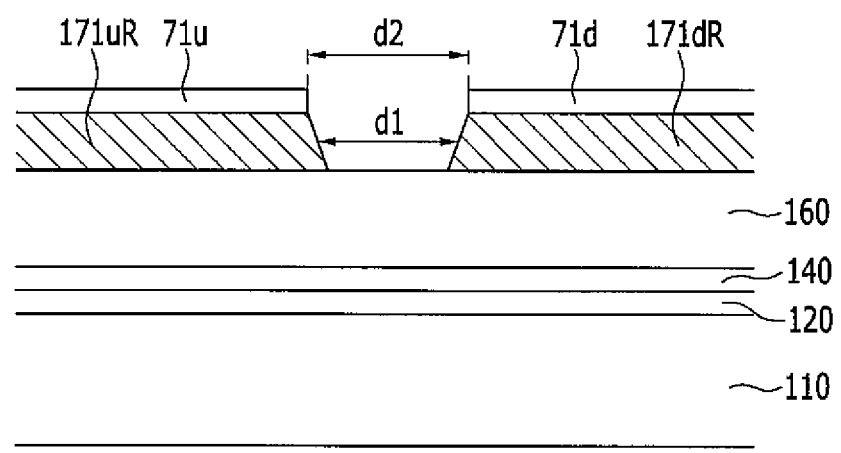
FIG. 14 is a cross-sectional view of FIG. 13 taken along the line XIV-XIV.

FIG. 8 is a top plan view of a step for forming data lines and a driving voltage line, FIG. 9 is a cross-sectional view of FIG. 8 taken along the line IX-IX, FIG. 10 is a top plan view of a step for forming a cover line on the data lines and the driving voltage line, FIG. 11 is a cross-sectional view of FIG. 10 taken along the line XI-XI, FIG. 12 is a drawing for describing a step of conducting an OS test for the data lines, FIG. 13 is a top plan view of a step in which the data lines are separated into lower data lines and upper data lines using the cover line as an etching mask, and FIG. 14 is a cross-sectional view of FIG. 13 taken along the line XIV-XIV.

With reference to FIGS. 8 and 9, a buffer layer 120, a gate insulating layer 140, a plurality of scan lines 121 (FIG. 4), and an interlayer insulating layer 160 are formed on a substrate 110, and a plurality of data lines 171R, 171G, and 171B and a vertical driving voltage line 172a are formed on the interlayer insulating layer 160.

Semiconductor layers 135a and 135b are formed between the buffer layer 120 and the gate insulating layer 140, and the scan lines 121 are formed between the gate insulating layer 140 and the interlayer insulating layer 160, but the semiconductor layers 135a and 135b and the scan lines 121 are omitted in FIGS. 8 and 9 since FIGS. 8 and 9 are enlarged views of a portion where the data lines and the vertical driving voltage line are formed.

Next, as shown in FIGS. 10 and 11, a cover line 71 is formed on the data lines 171R, 171G, and 171B to be separated into an upper cover line 71u and a lower cover line 71d.

In this case, a driving cover line 71r is formed on the vertical driving voltage line 172a.

The upper and lower cover lines 71u and 71d partially expose the data lines 171R, 171G, and 171B since they are separated by a cover separator d2.

The cover line 71 and the driving cover line 71r may be formed of amorphous ITO.

Then, an annealing process is performed for the cover line 71 and the driving cover line 71r that are formed of amorphous ITO, thereby allowing the cover line 71 and the driving cover line 71r to be formed of poly-ITO.

Next, as shown in FIG. 12, an OS test is conducted for the data lines 171R, 171G, and 171B.

Since the data lines 171R, 171G, and 171B are not separated into upper data lines 171uR, 171uG, and 171uB and lower data lines 171dR, 171dG, and 171dB, a pin 70 for the OS test is allowed to contact the data pad 179, and the OS test is conducted through scanning for all of the pixels.

As described above, the data lines 171R, 171G, and 171B are not yet separated into the upper data lines 171uR, 171uG, and 171uB and the lower data lines 171dR, 171dG, and 171dB and thus the OS test does not need to be separately conducted for the upper data lines 171uR, 171uG, and 171uB and the lower data lines 171dR, 171dG, and 171dB, thereby reducing a tact time of the OS test.

In addition, since no additional equipment is required to rotate an OLED display panel 10 by 180°, a manufacturing cost can be reduced.

Next, as shown in FIGS. 13 and 14, the upper data lines 171uR, 171uG, and 171uB and the lower data lines 171dR, 171dG, and 171dB are separated by etching the data lines 171R, 171G, and 171B that are exposed by the cover separator d2 for separating the upper cover line 71u from the lower cover line 71d.

In this case, the upper cover line 71u and the lower cover line 71d may serve as an etching mask since they are formed of poly-ITO.

As described above, in the digital driving method, a load of the data line can be minimized by separating the data lines into the upper data lines 171uR, 171uG, and 171uB and the lower data lines 171dR, 171dG, and 171dB.

Next, as shown in FIGS. 4 to 7, a plurality of switching elements and OLEDs OLEDu and OLEDd are formed such that they are respectively coupled to both the upper data lines 171uR, 171uG, and 171uB and the lower data lines 171dR, 171dG, and 171dB, thereby manufacturing the OLED display panel 10.

In addition, an upper data driver 31 and a lower data driver 32 are formed at upper and lower parts of the OLED display panel 10.

In the aforementioned exemplary embodiment, the OS test is conducted and then the upper and lower data lines are separated using the upper and lower cover lines 71u and 71d serving as the etching mask, but another exemplary embodiment may be possible in which the OS test is conducted and then the upper and lower data lines are separated using the separating hole that is formed in the passivation layer.

Another exemplary embodiment will be described in detail with reference to FIGS. 15 to 17.

Figure 15:
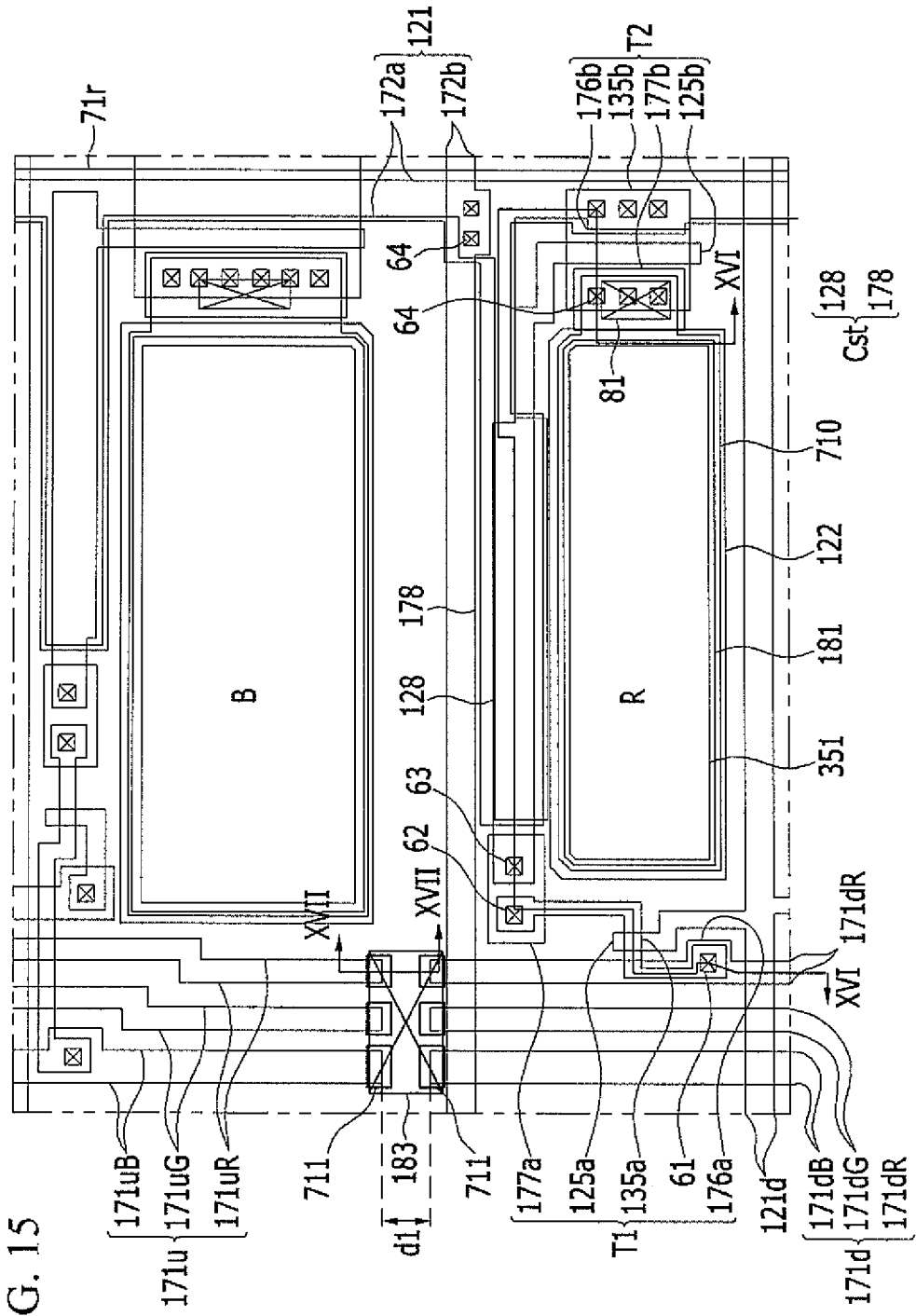
FIG. 15 is a layout view of two adjacent pixels of an OLED display according to another exemplary embodiment of the present disclosure.
Figure 16:
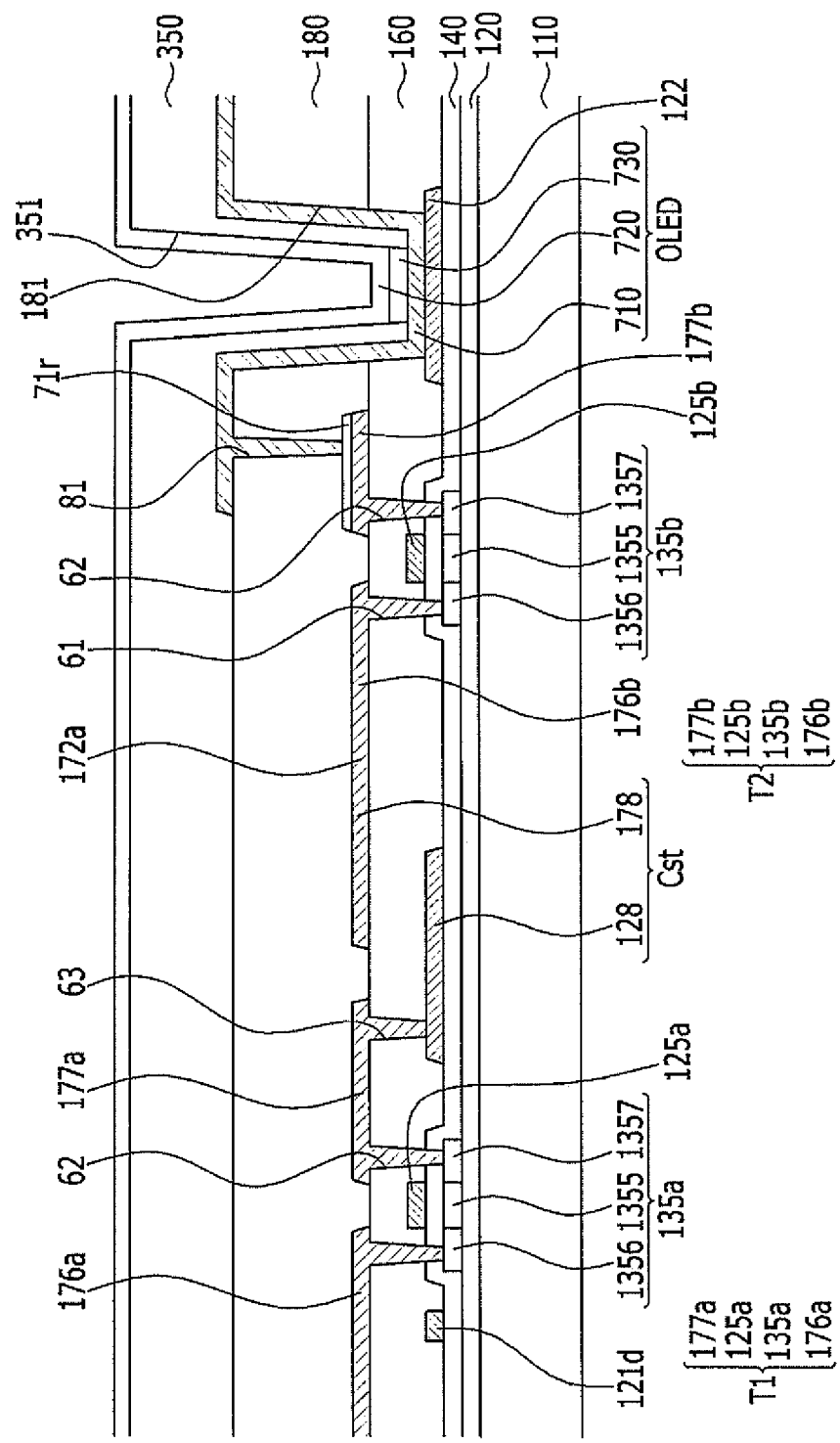
FIG. 16 is a cross-sectional view of FIG. 15 taken along the line XVI-XVI.
Figure 17:
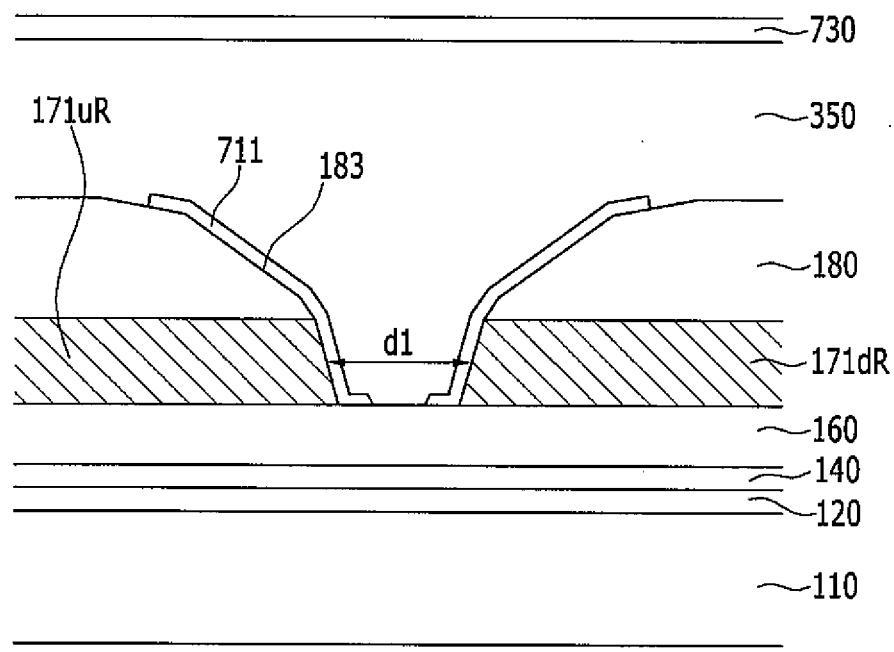
FIG. 17 is a cross-sectional view of FIG. 15 taken along the line XVII-XVII.

FIG. 15 is a layout view of two adjacent pixels of an OLED display according to another exemplary embodiment of the present disclosure, FIG. 16 is a cross-sectional view of FIG. 15 taken along the line XVI-XVI, and FIG. 17 is a cross-sectional view of FIG. 15 taken along the line XVII-XVII.

In FIG. 15, the upper blue pixel and the lower red pixel are illustrated, and a description will be made based on the lower red pixel.

Since the current exemplary embodiment illustrated in FIGS. 15 to 17 is substantially the same as the exemplary embodiment illustrated in FIGS. 1 to 7, except that a separating hole instead of the overcoat is formed in the passivation layer, a repeated description will be omitted.

As shown in FIGS. 15 to 17, a buffer layer 120 is formed on a substrate 110 of the OLED display according to the current exemplary embodiment of the present disclosure, and a switching semiconductor layer 135a and a driving semiconductor layer 135b are formed on the buffer layer 120.

A gate insulating layer 140 is formed on the switching semiconductor layer 135a and the driving semiconductor layer 135b, and a lower scan line 121d, a driving gate electrode 125b, a reflective layer 122, and a first storage capacitor plate 128 are formed on the gate insulating layer 140.

An interlayer insulating layer 160 is formed on the lower scan line 121d, the driving gate electrode 125b, the reflective layer 122, and the first storage capacitor plate 128, and upper and lower data lines 171u and 171d separated by a data separator d1, a vertical driving voltage line 172a, and a driving drain electrode 177b are formed on the interlayer insulating layer 160.

A driving cover line 71r is formed on the driving drain electrode 177b.

A passivation layer 180 is formed on the upper data line 171u, the lower data line 171d, the vertical driving voltage line 172a, and the driving cover line 71r.

A first pixel opening 181 is formed in the passivation layer 180 and the interlayer insulating layer 160 to expose the reflective layer 122.

In addition, a separating hole 183 is formed in the passivation layer 180 to expose the interlayer insulating layer 160.

A border line of the separating hole 183 coincides with a border line of the data separator d1.

A pixel electrode 710 is formed on the reflective layer 122 and the passivation layer 180 that are exposed by the first pixel opening 181, and a pixel cover member 711 is formed on the interlayer insulating layer 160 and the passivation layer 180 that are exposed by the separating hole 183 and the data separator d1.

The pixel cover member 711 covers lateral sides of the upper and lower data lines 171u and 171d that are exposed by the data separator d1.

Since the pixel cover member 711 covers the lateral sides of the upper and lower data lines 171u and 171d, the lateral sides of the upper and lower data lines 171u and 171d that are exposed by the separating hole 183 and the data separator d1 are prevented from being damaged due to revivification of silver by an etching solution in the etching process.

The pixel cover member 711 may be formed of the same material as the pixel electrode 710.

Measurement and inspection are performed with only a single scan in the OS test by conducting the OS test without separating the data line 171. Then, the exposed data line is partially etched such that it is separated into the lower data line 171d and the upper data line 171u, thereby minimizing the load of the data line in the digital driving method.

A manufacturing method of an OLED display according to a further exemplary embodiment of the present disclosure will now be described with reference to FIGS. 18 to 21 and FIGS. 15 to 17.

Since the manufacturing method of the current exemplary embodiment illustrated in FIGS. 18 to 21 is substantially the same as that of the exemplary embodiment illustrated in FIGS. 8 to 14, the same manufacturing method will be described with reference to FIGS. 8 to 14.

Figure 18:
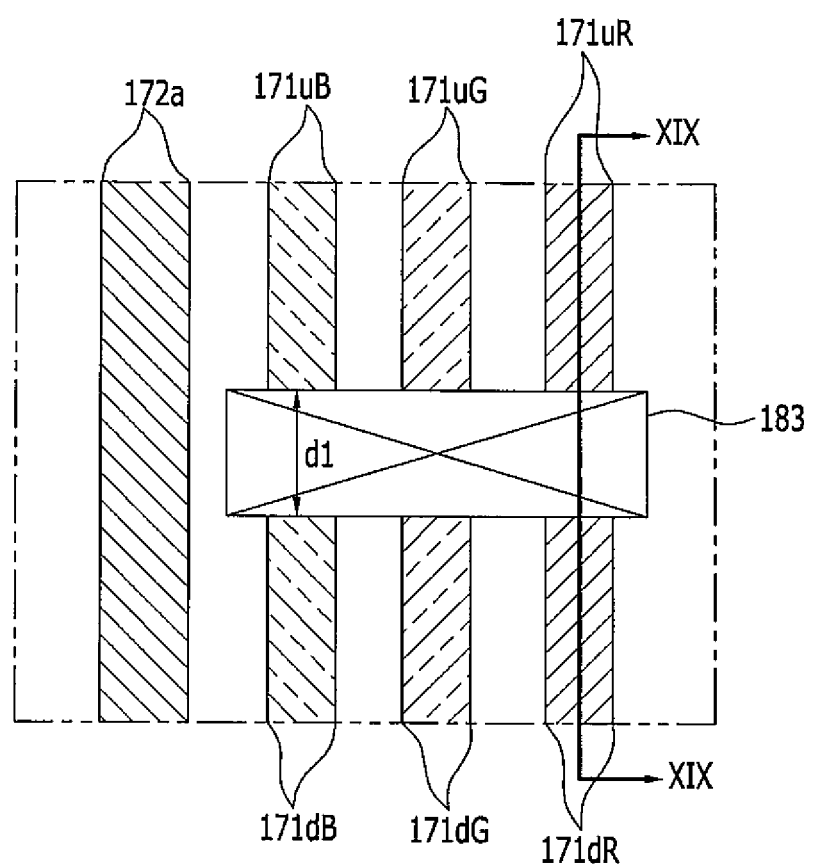
FIG. 18 is a top plan view of a step for separating the data lines into the lower data lines and the upper data lines by forming a separating hole in a passivation layer.
Figure 19:
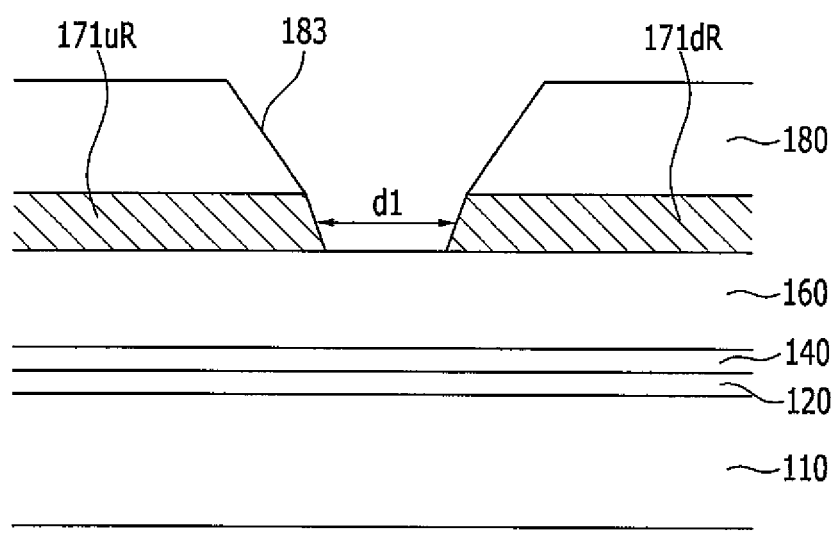
FIG. 19 is a cross-sectional view of FIG. 18 taken along the line XIX-XIX.
Figure 20:
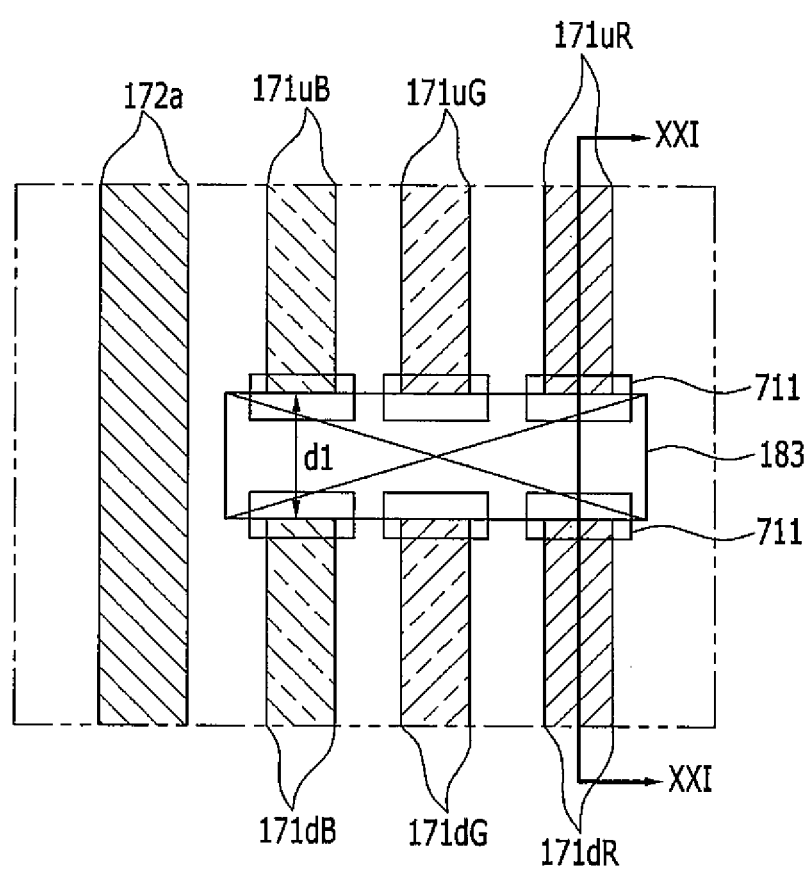
FIG. 20 is a top plan view of a step for forming a pixel cover member in the separating hole.
Figure 21:
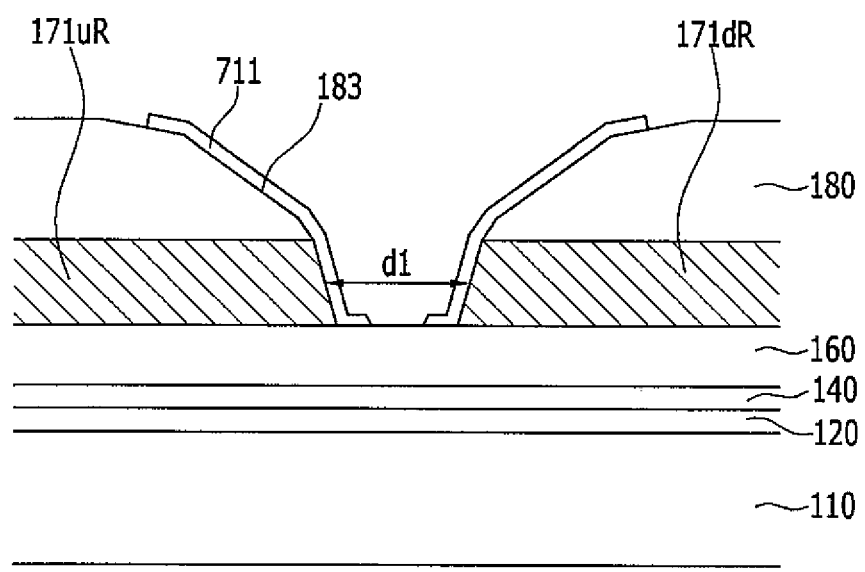
FIG. 21 is a cross-sectional view of FIG. 20 taken along the lines XXI-XXI.

FIG. 18 is a top plan view of a step for separating the data lines into the lower data lines and the upper data lines by forming a separating hole in a passivation layer, FIG. 19 is a cross-sectional view of FIG. 18 taken along the line XIX-XIX, FIG. 20 is a top plan view of a step for forming a pixel cover member in the separating hole, and FIG. 21 is a cross-sectional view of FIG. 20 taken along the lines XXI-XXI.

As shown in FIGS. 8 and 9, a buffer layer 120, a gate insulating layer 140, a plurality of scan lines 121, and an interlayer insulating layer 160 are formed on a substrate 110, and a plurality of data lines 171R, 171G, and 171B and a vertical driving voltage line 172a are formed on the interlayer insulating layer 160.

Next, as shown in FIG. 12, an OS test is conducted for the data lines 171R, 171G, and 171B.

Since the data lines 171R, 171G, and 171B are not yet separated into upper data lines 171uR, 171uG, and 171uB and lower data lines 171dR, 171dG, and 171dB, the OS test is conducted for all of the pixels while contacting a pin 70 for the OS test with a data pad 179.

As described above, since the data lines 171R, 171G, and 171B are not yet separated into the upper data lines 171uR, 171uG, and 171uB and the lower data lines 171dR, 171dG, and 171dB, the OS test does not need to be separately conducted for the upper data lines 171uR, 171uG, and 171uB and the lower data lines 171dR, 171dG, and 171dB, thereby reducing a tact time of the OS test.

In addition, a manufacturing cost can be reduced since additional equipment is not required to rotate an OLED display panel 10 by 180°.

Next, as shown in FIGS. 18 and 19, a passivation layer 180 including a separating hole 183 is formed on the data lines 171R, 171G, and 171B.

The data lines 171R, 171G, and 171B exposed by the separating hole 183 are etched such that they are separated into the upper data lines 171uR, 171uG, and 171uB and the lower data lines 171dR, 171dG, and 171dB.

As described above, by separated the data lines into the upper data lines 171uR, 171uG, and 171uB and the lower data lines 171dR, 171dG, and 171dB a load of the data line can be minimized in a digital driving method.

Next, as shown in FIGS. 20 and 21, pixel cover members 711 are formed on the interlayer insulating layer 160 and the passivation layer 180 that are exposed by the separating hole 183 and a data separator d1.

Since the pixel cover members 711 cover the lateral sides of the upper and lower data lines 171u and 171d, the separating hole 183, and the lateral sides of the upper and lower data lines 171u and 171d exposed by the data separator d1 are prevented from being damaged due to revivification of silver by an etching solution in an etching process.

The pixel cover members 711 may be formed of the same material as the pixel electrode 710.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

Description of Symbols

71u: upper cover line   71d: lower cover line
121: scan line   121u: upper scan line
121d: lower scan line   171u: upper data line
171d: lower data line   172: driving voltage line
172a: vertical driving voltage line  172b: horizontal driving voltage line
183: separating hole

What is claimed is:

1. An organic light emitting diode (OLED) display comprising:
an OLED display panel comprising:
a substrate;
a plurality of scan lines on the substrate;
a plurality of data lines crossing the plurality of scan lines, each of the data lines being configured to transmit a data signal;
a plurality of driving voltage lines crossing the plurality of scan lines, each of the driving voltage lines being configured to transmit a driving voltage;
cover lines covering the data lines and the driving voltage lines;
a plurality of switching elements coupled to the plurality of scan lines and the plurality of data lines; and
a plurality of OLEDs coupled to the plurality of switching elements; and
upper and lower data drivers respectively located at upper and lower parts of the OLED display panel, wherein the data lines include an upper data line and a lower data line that are separated from each other, wherein the cover lines include upper cover lines covering the upper data lines, lower cover lines covering the lower data lines, and driving cover lines covering the driving voltage lines, wherein the upper cover line and the lower cover line that are separated from each other, wherein the plurality of OLEDs include an upper OLED located at an upper half of the OLED display panel and a lower OLED located at a lower half of the OLED display panel, and wherein a portion of the driving cover lines disposed in the upper OLED is connected with the portion of the driving cover lines disposed in the lower OLED.

2. The OLED display of claim 1, wherein the switching element includes a switching transistor and a driving transistor, and wherein the OLED display panel is configured to be digitally driven wherein an emitting time is controlled by switching operations of the driving transistor to express gray levels.

3. The OLED display of claim 1, wherein the upper data driver is configured to transmit a data signal to the upper OLED through the upper data line, and wherein the lower data driver is configured to transmit a data signal to the lower OLED through the lower data line.

4. The OLED display of claim 1, wherein the data lines and the cover lines are respectively separated by a data separator and a cover separator.

5. The OLED display of claim 1, wherein the cover line comprises indium tin oxide (ITO).

6. An OLED display comprising:
  an OLED display panel comprising:
    a substrate;
    a plurality of scan lines on the substrate;
    a plurality of data lines crossing the plurality of scan lines;
    a plurality of switching elements coupled to the plurality of scan lines and the plurality of data lines;
    a passivation layer covering the data lines and the switching elements; and including a separating hole partially exposing a data line; and
    a plurality of OLEDs coupled to the plurality of switching elements, each of the OLEDs comprising a pixel electrode on the passivation layer; and
  upper and lower data drivers respectively located at upper and lower parts of the OLED display panel, wherein the data line includes upper and lower data lines that are separated from each other, wherein a lateral side of the upper data line faces a lateral side of the lower data line and wherein a border line of the separating hole formed in the passivation layer and a border line of the data separator coincide with each other; and
  pixel cover members covering lateral side of the upper and lower data lines exposed by the data separator, wherein the pixel cover members comprise the same material as the pixel electrode.

7. The OLED display of claim 6, wherein the switching elements include a switching transistor and a driving transistor, and wherein the OLED display panel is configured to be digitally driven in which an emitting time is controlled by switching operations of the driving transistor to express gray levels.

8. The OLED display of claim 6, wherein the OLED further comprises:
  an organic emission layer formed on the pixel electrode; and
  a common electrode formed on the organic emission layer.

* * * * *